US008623688B2

(12) United States Patent
Geerligs et al.

(10) Patent No.: US 8,623,688 B2
(45) Date of Patent: Jan. 7, 2014

(54) SOLAR CELL AND METHOD FOR MANUFACTURING SUCH A SOLAR CELL

(75) Inventors: Lambert Johan Geerligs, Petten (NL); Gaofei Li, Petten (NL); Paul Cornelis Barton, Petten (NL); Ronald Cornelis Gerard Naber, Petten (NL); Arno Ferdinand Stassen, Petten (NL); Zhiyan Hu, Petten (NL)

(73) Assignee: Stichting Energieonderzoek Centrum Nederland, Petten (NL)

( * ) Notice: Subject to any disclaimer, the term of this patent is extended or adjusted under 35 U.S.C. 154(b) by 0 days.

(21) Appl. No.: 13/391,915

(22) PCT Filed: Aug. 24, 2010

(86) PCT No.: PCT/NL2010/050531
§ 371 (c)(1), (2), (4) Date: Apr. 10, 2012

(87) PCT Pub. No.: WO2011/025372
PCT Pub. Date: Mar. 3, 2011

(65) Prior Publication Data
US 2012/0181667 A1 Jul. 19, 2012

(30) Foreign Application Priority Data
Aug. 25, 2009 (NL) ..................................... 2003390

(51) Int. Cl.
*H01L 21/00* (2006.01)
(52) U.S. Cl.
USPC ...................... 438/57; 438/546; 257/E21.135
(58) Field of Classification Search
USPC .................. 438/480, 560, 561; 257/E21.056, 257/E21.057, E21.14, E21.147
See application file for complete search history.

(56) References Cited

U.S. PATENT DOCUMENTS

| 6,207,890 | B1 | 3/2001 | Nakai et al. | |
|---|---|---|---|---|
| 2007/0209697 | A1 | 9/2007 | Karakida et al. | |
| 2009/0325336 | A1* | 12/2009 | Abbott et al. | 438/57 |
| 2011/0174371 | A1 | 7/2011 | Olibet et al. | |

FOREIGN PATENT DOCUMENTS

WO 2010/023318 A1 3/2010

OTHER PUBLICATIONS

Beaucarne G. et al.: "Epitaxial thin-film Si solar cells" Thin Solid Films, Elsevier-Sequoia S.A. Lausanne, CH, vol. 511-512, Jul. 26, 2006, pp. 533-542, XP025007243 ISSN: 0040-6090 [retrieved on Jul. 26, 2006] the whole document, Cited in ISR.

(Continued)

*Primary Examiner* — Cheung Lee
(74) *Attorney, Agent, or Firm* — Young & Thompson

(57) ABSTRACT

A method for manufacturing a solar cell from a semiconductor substrate (1) of a first conductivity type, the semiconductor substrate having a front surface (2) and a back surface (3). The method includes in a sequence: texturing (102) the front surface to create a textured front surface (2*a*); creating (103) by diffusion of a dopant of the first conductivity type a first conductivity-type doped layer (2*c*) in the textured front surface and a back surface field layer (4) of the first conductivity type in the back surface; removing (105; 104*a*) the first conductivity-type doped layer from the textured front surface by an etching process adapted for retaining texture of the textured front surface; creating (106) a layer of a second conductivity type (6) on the textured front surface by diffusion of a dopant of the second conductivity type into the textured front surface.

31 Claims, 10 Drawing Sheets

(56) References Cited

OTHER PUBLICATIONS

Miles et al.: "Inorganic photovoltaic cells" Materials Today, Elsevier Science, Kidlington ,GB, vol. 10, No. 11, Oct. 12, 2007, pp. 20-27, XP022297610 ISSN: 1369-7021 the whole document, Cited in ISR.
Wenham S. R. et al.: "Surface passivation in high efficiency silicon solar cells" Solar Energy Materials and Solar Cells, Elsevier Science Publishers, Amsterdam, NL, vol. 65, No. 1-4, Jan. 1, 2001, pp. 377-384, XP004217141 ISSN: 0927-0248 the whole document, Cited in ISR.
International Search Report, dated Sep. 22, 2010, from corresponding PCT application.

* cited by examiner

SOLAR CELL AND METHOD FOR MANUFACTURING SUCH A SOLAR CELL

FIELD OF THE INVENTION

The present invention relates to a solar cell. Also, the present invention relates to a method for manufacturing such a solar cell.

BACKGROUND OF THE INVENTION

Such a solar cell relates to a solar cell with p- or n-type base.

The solar cell comprises a semiconductor substrate, e.g. silicon, which is covered on a back side by the p- or n-type back surface field (BSF) layer and on a front side by an emitter layer of a conductivity type opposite to that of the base layer. The front side of the substrate is arranged to be directed towards a light source during use of the solar cell.

In the prior art, the p- or n-type back surface field layer (BSF layer), is for example manufactured by a screen printing process (but also $POCl_3$ face-to-face tube furnace diffusion, spray coating, spin coating, etc. can be used). During the screen printing process, a paste that comprises a p- or n-type element as dopant element is printed one-sidedly on the back side of the substrate. Next, a first diffusion process is carried out in which the substrate with the printed paste is heated to diffuse the p- or n-type element into the substrate to form the p- or n-type BSF layer. Such a heat treatment is typically carried out in an inline diffusion furnace. Subsequently, on the front side a layer of opposite conductivity type is formed by a second diffusion process, which is carried out in a second diffusion furnace. Alternatively, the emitter layer may be created first, followed by a creation of the BSF base layer.

The prior art manufacturing process has some disadvantages. The screen printing method to form the BSF layer on the back side may cause contamination of the front side of the substrate by parasitic diffusion or spill over of the dopant source to the front side. Parasitic diffusion of the dopant on the front side results in a non-uniform dopant concentration profile for the emitter layer which will adversely affect the efficiency of the solar cell. For example, shunt or high reverse current are typical effects. Furthermore, screen printing reduces the yield of the manufacturing process due to a relatively high chance of breakage of substrates.

Also, for n-type BSF layers that use phosphorus as n-type dopant, a one-sided diffusion results in a less efficient gettering of impurities from the substrate.

SUMMARY OF THE INVENTION

High efficiency silicon solar cells based on silicon wafers may need to have the wafer surfaces well passivated. For this passivation, the surfaces of the wafers are typically coated with dielectric layers, such as a silicon nitride.

High efficiency silicon solar cells based on silicon wafers typically have diffused emitter and often also diffused back surface field (BSF) or front surface field (FSF) layers on areas of their surfaces. For example, one side of the wafer can be nearly totally covered with emitter layer, and the other side nearly totally covered with a BSF layer. These layers serve the purpose of providing good contact with metal grids, and providing or enhancing the surface passivation. For best surface passivation, these diffused layers have to be coated with suitable dielectric layers, such as a silicon nitride.

In summary, the best surface passivation is usually obtained by a combination of a diffused layer and a suitable dielectric coating on that layer.

Known dielectric coatings that can perform surface passivation on a diffused layer include silicon nitride, thermally grown oxide, aluminium oxide, silicon carbide, and a stack of a wet-chemically grown silicon oxide and silicon nitride.

Silicon solar cells based on silicon wafers typically have at least the front surface textured to enhance light trapping. For mono crystalline silicon cells, an industrially much used texture is e.g. a random pyramid texture obtained by a wet-chemical alkaline etch, or an inverted pyramid texture obtained by a masked alkaline etch. For multicrystalline silicon cells, an industrially much used texture is e.g. an isotexture obtained by a wet-chemical acid etch.

The rear side of such silicon solar cells can be non-textured or textured. Usually a non-textured (that means: polished) rear surface is better for light trapping and surface passivation, but for practical reasons the front and the rear side of a solar cell are often textured simultaneously (by immersing in a liquid solution) and both are left textured throughout the production process. There are commercial tools available that polish the rear side of a solar cell at some point in the production process (after texturing both sides), for example from the company Rena. These tools remove a relatively large amount of silicon from the rear side, making the process costly and time-consuming. For the front side of a solar cell, removal of texture to improve surface passivation may not be a useful process, since it will strongly increase the reflection and therefore reduce the cell efficiency.

A special type of silicon solar cell based on silicon wafers is the silicon heterojunction solar cell, such as the HIT cell from the company Sanyo. That solar cell does not contain diffused layers. The surfaces are covered by thin layers of amorphous silicon, which provide the emitter and back surface field as well as a passivating effect, by band bending in the silicon wafer, induced by the doping in the amorphous silicon layers, and bandgap and work function differences between wafer, amorphous silicon, and possible other layers on top of the amorphous silicon.

Sanyo has reported (U.S. Pat. No. 6,207,890) that applying a certain rounding to a random pyramid texture, particularly a slight rounding (increasing the radius of curvature) of the valleys between pyramids, enhances the passivation obtained by subsequent deposition of amorphous or microcrystalline silicon layers. The improved passivation is explained as due to a more uniform coverage of the wafer by the thin film. University of Neuchatel has reported (application WO2010/023318) that the benefit of rounding of the valleys between pyramids for the passivation by an amorphous silicon layer is due to the suppression of epitaxial growth of silicon.

Chen et al. (F. Chen et al., $4^{th}$ World conference on photovoltaic energy conversion, 2006, page 1020) have investigated and reported the benefit of rounding of random pyramid texture of silicon wafers, without doped layer such as emitter or BSF or FSF, for surface passivation by silicon nitride deposited by PECVD, and did not find a significant improvement of passivation.

McIntosh et al. (K. R. McIntosh and L. P. Johnson, J. Appl. Phys. 105, 124520-1 (2009) have investigated and reported the benefit of rounding of random pyramid texture of silicon wafers for surface passivation with thermally grown silicon oxide. They find a benefit of rounding for the passivation quality of thick thermal oxide layers (100 nm thick oxide, grown at 1100° C.). The reason is that rounding reduces the creation of defects caused by the volume expansion during the growth of silicon oxide from silicon. However, growth of such thermal oxide layers may require a high thermal budget, which is unfavorable for wafer quality, yield, and production cost.

It is an object of the present invention to provide a method for manufacturing the solar cell with p- or n-type base, which overcomes or reduces the disadvantages as mentioned above.

This invention provides a structure and a method for improved surface passivation on textured wafers with diffused emitter and/or diffused BSF and/or diffused FSF.

The method involves the rounding of texture of a silicon wafer before diffusion of a doped layer. The method involves the passivation of the doped layer by a thin dielectric film. The dielectric film can be, for example, a deposited silicon nitride, aluminium oxide, or a stack of very thin wet-chemically grown oxide with a deposited thin film of silicon nitride or aluminium oxide. Methods to create a diffused doped layer should be understood to include the method of implantation of dopants followed by thermal anneal.

According to a first aspect of the invention, the object is achieved by a method for manufacturing a solar cell from a semiconductor substrate of a first conductivity type, the semiconductor substrate having a front surface and a back surface, the method comprising, preferably in the indicated sequence:

texturing the front surface to create a textured front surface and texturing the back surface to create a textured back surface;

partly smoothening the textured back surface and optionally partly smoothening the textured front surface;

creating by diffusion of a dopant of the first conductivity type a back surface field layer of the first conductivity type in the back surface and optionally a first conductivity-type doped layer in the textured front surface and;

optionally removing the first conductivity-type doped layer from the textured front surface by an etching process adapted for retaining texture of the textured front surface;

creating a layer of a second conductivity type on the textured front surface by diffusion of a dopant of the second conductivity type into the textured front surface.

Advantageously, the method provides an enhanced manufacturing with less variation between individual solar cells: A parasitic doping (either p-type or n-type) from one surface of the silicon substrate to another surface, especially from the BSF side to the emitter side, is prevented in an easy way by the method. Also, a screen printing step is omitted which reduces yield loss due to breakage. Moreover, two-sided diffusion of phosphorus in both front and back surfaces allows an improved gettering of impurities from the silicon substrate.

The partial smoothening may be performed by etching with a HF and/or HNO$_3$ containing liquid. The partial smoothening may for instance result in removing away a layer of average thickness of about 50 nm-2 µm. This average thickness removed may for instance be determined from the change of total mass of the wafer due to the partial smoothening step.

Also advantageously, the method may result in higher efficiency of the solar cells due to improved surface passivation of surfaces with doped layers, when the texture features on these surfaces are (even slightly) smoothened. This improved surface passivation may especially be obtained with a dielectric coating, for example silicon nitride deposited by PECVD (plasma enhanced chemical vapour deposition), or a stack of wet chemically grown silicon oxide with (PECVD) silicon nitride, or aluminium oxide, stacks of these or other deposited dielectrics, etc. Hence, herein especially no thermally grown (silicon) oxide layer is used to provide a surface passivation layer.

Hence, in an embodiment, the method of the invention may further include creating a passivation layer, such as selected from the group consisting of silicon nitride, silicon oxide (thus not a thermally grown silicon oxide), silicon carbide, and aluminium oxide, and optionally other materials, on one or both doped layers (i.e. on the back surface field layer of the first conductivity type and optionally the second conductivity type layer comprised by the textured front surface). In a specific embodiment, a combination of one of those dielectric materials may be applied, especially in a multi-layer structure (on one or both doped layers). The creation of the passivation layer may especially be done with PECVD, low pressure chemical vapour deposition, atmospheric pressure chemical vapour deposition, atomic layer deposition, sputtering, or by wet growth of layers. In a specific embodiment, the method may (thus) further include creation of a passivation layer by one or more of the following techniques: plasma enhanced chemical vapour deposition, sputtering, atomic layer deposition, wet chemical oxidation (on one or more of the doped layers).

In an embodiment, the invention relates to the method as described above, wherein texturing the front surface to create a textured front surface comprises texturing the back surface to create a textured back surface.

The partial smoothening process may substantially retain the texture of the textured back surface (and of the textured front surface). The partial smoothening is especially performed by a (light) polishing. This may reduce cost and process time, while at the same time being very effective in improving passivation. For the front surface the partial smoothening is preferably very light to avoid increasing reflectance by an unacceptable amount, e.g. by more than 2 or 3 percentage points at a wavelength of 1000 nm (relative to the non-smoothened textured surface), for instance from 11% reflectance to 13% reflectance. Hence, in an embodiment, the invention relates to the method as described above, wherein the creation of the back surface field layer is preceded by (light) polishing the textured back surface of the semiconductor substrate. Alternatively, both the textured front surface and the textured back surface may be partial smoothened by (light) polishing.

In an embodiment, partly smoothening the textured front surface is performed by removing the first conductivity-type doped layer from the textured front surface by an etching process adapted for retaining texture of the textured front surface. Thus, by partial smoothening the texture may substantially be retained.

In an embodiment, the invention relates to the method as described above, comprising during the diffusion of the dopant of the first conductivity type, a formation of a dopant containing glassy layer on the front surface and the back surface from a precursor of the first conductivity type, the dopant containing glassy layer acting as dopant source for the semiconductor substrate.

In an embodiment, the invention relates to the method as described above, comprising removing the dopant containing glassy layer from the textured front surface and the textured back surface preceding the removal of the first conductivity-type doped layer from the textured front surface.

In an embodiment, the invention relates to the method as described above, comprising removing the dopant containing glassy layer from the textured front surface while removing the first conductivity-type doped layer from the textured front surface, in a single sided etching process.

In an embodiment, the invention relates to the method as described above, comprising removing the dopant containing glassy layer from the textured back surface after the removal of the dopant containing glassy layer from the textured front surface and the first conductivity-type doped layer from the textured front surface in the single sided etching process.

In an embodiment, the invention relates to the method as described above, comprising preceding the removal of the first conductivity-type doped layer from the textured front surface:
  removing the dopant containing glassy layer from the front surface and the back surface, and
  creating a protective layer on the back surface field layer.

In an embodiment, the invention relates to the method as described above, comprising:
  after creating the first conductivity-type doped layer in the textured front surface and the back surface field layer of the first conductivity type in the back surface: creating a protective layer on the back surface field layer, before the removal of the dopant containing glassy layer from the front surface while removing the first conductivity-type doped layer from the textured front surface in a single sided etching process.

In an embodiment, the invention relates to the method as described above, comprising:
after the removal of the dopant containing glassy layer from the textured front surface while removing the first conductivity-type doped layer from the textured front surface in a single sided etching process and preceding the creation of the layer of the second conductivity type on the textured front surface:
  removing the protective layer and the dopant containing glassy layer from the textured back surface.

In an embodiment, the invention relates to the method as described above, wherein the protective layer comprises a coating layer containing at least one material selected from a group of aluminum oxide ($Al_2O_3$), silicon nitride ($SiN_x$), a dielectric, and a resist.

In an embodiment, the invention relates to the method as described above, wherein creating the back surface field layer by diffusion of the dopant of the first conductivity type comprises exposing the back surface to a precursor of the first conductivity type at elevated temperature.

In an embodiment, the invention relates to the method as described above, wherein the precursor of the first conductivity type contains the dopant of the first conductivity type; the precursor being selected from one of a gaseous precursor, a liquid precursor, a paste precursor and a plasma precursor.

In an embodiment, the invention relates to the method as described above, wherein the diffusion of the dopant of the first conductivity type is optimized to create a thickness of the first conductivity-type doped layer in the textured front surface which is 0.7 micron or less.

In an embodiment, the invention relates to the method as described above, wherein the diffusion of the dopant of the first conductivity type is optimized to create a thickness of the first conductivity-type doped layer in the textured front surface which is 0.3 micron or less. In an embodiment, the invention relates to the method as described above, wherein creating the layer of the second conductivity type on the textured front surface by diffusion of the dopant of the second conductivity type comprises exposing the textured front surface to a precursor of the second conductivity type at elevated temperature.

In an embodiment, the invention relates to the method as described above, wherein the precursor of the second conductivity type is a gaseous precursor, the gaseous precursor containing the dopant of the second conductivity type.

In an embodiment, the invention relates to the method as described above, wherein the first conductivity type is n-type and the second conductivity type is p-type, or the first conductivity type is p-type and the second conductivity type is n-type.

In an embodiment, the invention relates to the method as described above, wherein a thickness of the first conductivity-type doped layer is less than an average height of a texture feature on the textured front surface.

In an embodiment, the invention relates to the method as described above, wherein the average height of the texture feature on the textured front surface is at least about 2 micron and the thickness of the first conductivity type doped layer is about 0.7 micron or less.

In an embodiment, the invention relates to the method as described above, wherein the average height of the texture feature on the textured front surface is at least about 2 micron and the thickness of the first conductivity type doped layer is about 0.3 micron or less.

In an embodiment, the invention relates to the method as described above, wherein the average height of the texture feature on the textured back surface is at least about 2 micron.

In an embodiment, the invention relates to the method as described above, wherein the etching process adapted for retaining texture of the textured front surface is performed by a single-sided wet-chemical process using an etching agent.

In an embodiment, the invention relates to the method as described above, wherein the etching agent comprises a component for texturing a semiconductor surface.

In a specific and preferred embodiment, the invention relates to the method as described above, wherein the etching agent further comprises a component for polishing the semiconductor surface.

In a specific embodiment, the invention relates to the method as described above, wherein the etching process adapted for retaining texture of the textured front surface is performed by a dry etching method.

In an embodiment, the invention relates to the method as described above, where the doped surfaces are coated by deposition of a dielectric coating such as silicon nitride, silicon carbide, silicon oxide (not a thermally grown silicon oxide), aluminum oxide, etc. by plasma enhanced chemical vapour deposition, sputtering, atomic layer deposition, etc., or a stack of such layers, optionally in combination with first growing a thin silicon oxide by wet-chemical means. Such coating may especially improve passivation, especially in combination with the partly smoothened texture.

In an embodiment, the invention relates to the method as described above, wherein the removing of the first conductivity type doped layer from the textured front side and the dopant containing glassy layer from the front surface is performed during the etching process adapted for retaining texture of the textured front surface.

In an embodiment the invention relates to the method as described above, wherein the creation of texture is by creation of a pyramid texture, for instance a random pyramid structure or an inverted pyramid texture. Optionally, also an isotropic texture may be created. In an embodiment the invention relates to the method as described above, wherein the creation of texture is by creation of random pyramid texture by etching in an alkaline solution. Hence, in an embodiment, the phrase "texturing the front surface and/or texturing the back surface", or similar phrases, may include creating a pyramidal shapes containing front surface and/or a pyramidal shapes containing back surface. In a specific embodiment, the pyramidal shapes may include a pyramid structure, such as a random pyramid structure.

Hence, specific embodiments include:

The method as described herein, wherein texturing the front surface and texturing the back surface includes creating a pyramidal shapes containing front surface and a pyramidal shapes containing back surface.

Such method, wherein the partial smoothening includes broadening intermediate valleys between pyramidal shapes to provide valleys with widths selected from the range of 50-2000 nm.

Such method, wherein the partial smoothening includes rounding intermediate valleys between pyramidal shapes to provide valleys with curvatures having radii selected from the range of 25-1000 nm.

A method as described herein, further including creating a passivation layer, such as selected from the group consisting of silicon nitride, silicon oxide (not a thermally grown silicon oxide), silicon carbide, and aluminium oxide, and optionally other materials, on one or both doped layers.

Such method, wherein the passivation layer is created by one or more of the following techniques plasma enhanced chemical vapour deposition, low pressure chemical vapour deposition, atmospheric pressure chemical vapour deposition, sputtering, atomic layer deposition, wet chemical oxidation.

A method as described herein, wherein the partial smoothening comprises etching the textured back surface and optionally the textured front surface with an etching agent.

A method as described herein, wherein the partial smoothening is performed by dry etching the textured back surface and optionally the textured front surface.

Other specific embodiments include:

A semiconductor substrate of a first conductivity type, having a textured front surface and a textured back surface, wherein the textured front surface comprises a second conductivity-type doped layer, wherein the textured back surface comprises a surface field layer of the first conductivity type, and wherein the textured back surface comprises a pyramidal shapes containing back surface with intermediate valleys having widths selected from the range of 50-2000 nm.

Such semiconductor substrate, having valleys with curvatures having radii selected from the range of 25-1000 nm.

Such semiconductor substrate, further comprising a passivation layer on the surface field layer of the first conductivity type and on the second conductivity-type doped layer.

Such semiconductor substrate, wherein the passivation layer include one or more of silicon nitride, silicon oxide (not a thermally grown silicon oxide), silicon carbide and aluminium oxide.

Further embodiments are defined by the dependent claims as appended.

The term "substantially" herein, will be understood by the person skilled in the art. The term "substantially" may also include embodiments with "entirely", "completely", "all", etc. Hence, in embodiments the adjective substantially may also be removed. Where applicable, the term "substantially" may also relate to 90% or higher, such as 95% or higher, especially 99% or higher, even more especially 99.5% or higher, including 100%. The term "comprise" includes also embodiments wherein the term "comprises" means "consists of".

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The devices herein are amongst others described during operation. As will be clear to the person skilled in the art, the invention is not limited to methods of operation or devices in operation.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "to comprise" and its conjugations does not exclude the presence of elements or steps other than those stated in a claim. The article "a" or "an" preceding an element does not exclude the presence of a plurality of such elements. In the device claim enumerating several means, several of these means may be embodied by one and the same item of hardware. The mere fact that certain measures are recited in mutually different dependent claims does not indicate that a combination of these measures cannot be used to advantage.

BRIEF DESCRIPTION OF THE DRAWINGS

Embodiments of the invention will now be described, by way of example only, with reference to the accompanying schematic drawings in which corresponding reference symbols indicate corresponding parts, and in which.

DESCRIPTION OF PREFERRED EMBODIMENTS

Figure 1:
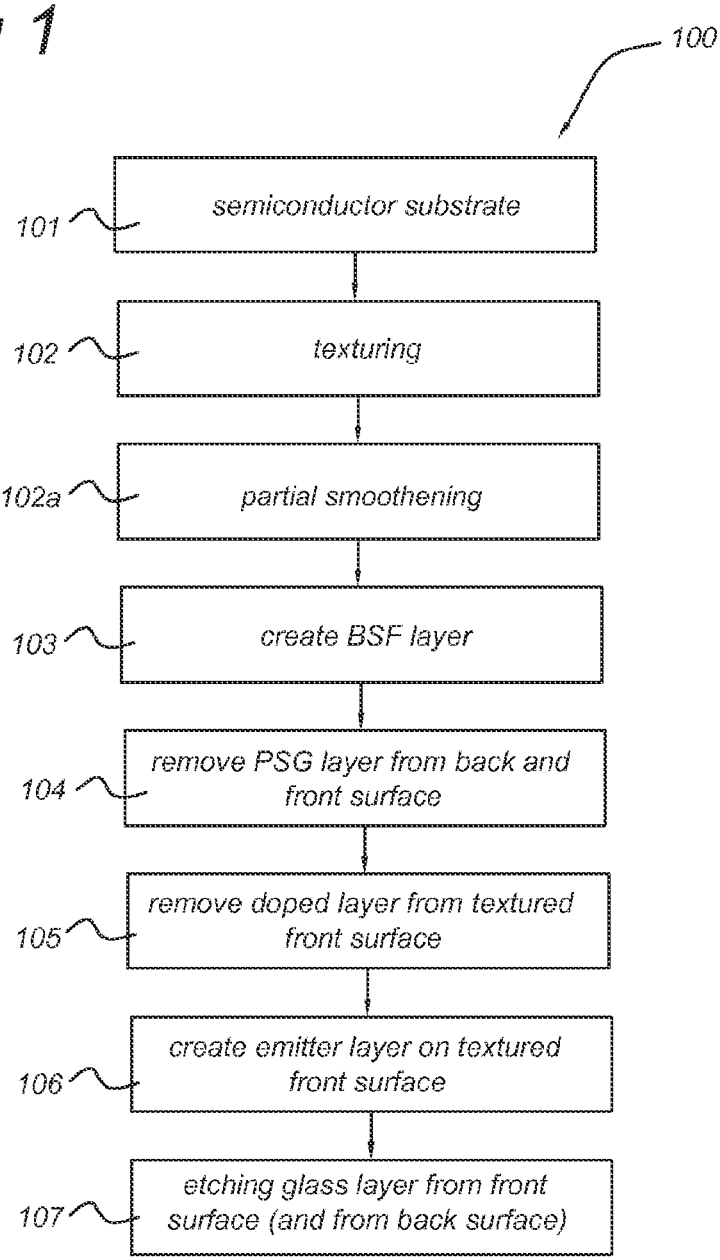
FIG. 1 shows a flow diagram for a method for manufacturing a solar cell in accordance with a first aspect of the invention.

FIG. 1 shows a flow diagram for a method for manufacturing a solar cell in accordance with a first aspect of the invention.

According to the first aspect, the method comprises a sequence 100 of processes to manufacture a solar cell with either p- or n-type base.

Below, the sequence 100 is illustrated for a solar cell with n-type base.

A single crystal or multi-crystalline semiconductor substrate i.e., a silicon substrate 1 with n-type conductivity is provided as precursor for the solar cell. The silicon substrate has a front surface 2 and a back surface 3. The front surface is arranged as surface for receiving light during use of the solar cell.

In an alternative embodiment, the silicon substrate is doped to have a conductivity of p-type.

Figure 5:
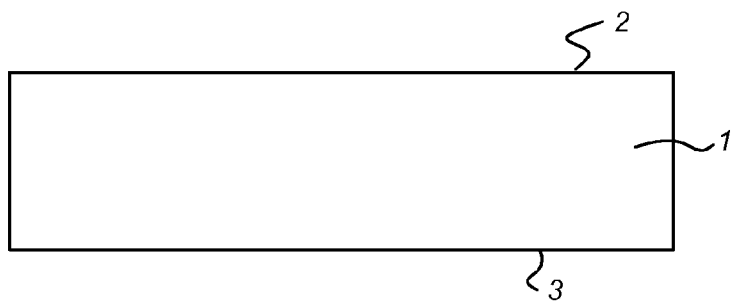
FIG. 5 shows a cross-section of a semiconductor substrate for manufacturing the solar cell.

FIG. 5 shows a cross-section of the silicon substrate for manufacturing the solar cell.

Referring again to FIG. 1, next, in process 102, the method provides texturing of the surfaces 2, 3 of the silicon substrate 1 by exposing the surface(s) to be textured to a texture etching agent.

The front surface 2 is textured to create a surface topography (also referred to as texture features) resulting in a low reflectivity of the surface. For example, the texturing recipe can be tuned to obtain as texture features large pyramids on the surface (e.g. an average pyramid height of about 2 microns or more).

In this method the texturing process may be adjusted to maintain a low reflectivity after a later removal step of a doped surface layer. The back surface 3 is either textured to create a surface topography (also referred to as texture features) resulting in a low reflectivity of the surface or polished to create a surface topography resulting in a high reflectivity.

The textured surface of the back surface 3 does not have to be identical to the textured front surface 2.

It is possible to create a surface texture either in a single-sided manner on the front surface 2a or in a two-sided manner on both front and back surfaces 2a, 3a.

In case of two-sided texturing, the back surface 3a may be polished in a single-side polishing etching step to remove the texture, and to improve optical and passivation properties.

Additionally, in process 102 the texturing may be combined with an etching process for saw damage removal. Combining saw damage removal and texturing may be advantageous for silicon substrates that have not been pre-polished after slicing from a silicon ingot. Alternatively, the texturing 102 may also be preceded by such an etching process for saw damage removal.

Figure 6A:
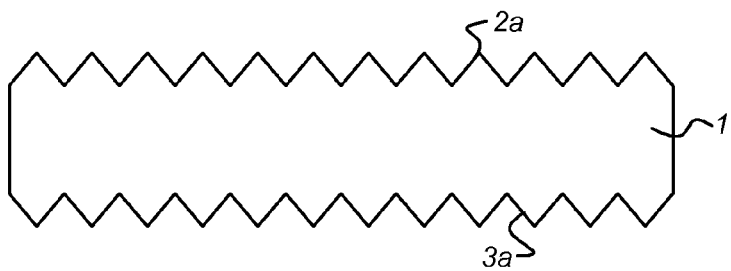
FIG. 6a, 6b show a cross-section of the solar cell after a next stage of the method.

FIG. 6a shows a cross-section of the solar cell after creation of texture.

In the process 102 as described above, the texture is created by exposing the surface(s) to be textured to a texture etching agent. Such a texturing agent may be an alkaline or acid solution, but it could also be a plasma for dry etching.

Figure 6B:
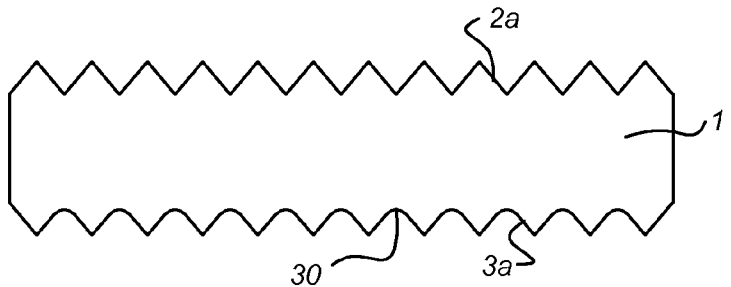

FIG. 6a shows a cross-section of the solar cell after creation of texture on the front and back surfaces 2a, 3a. FIG. 6b shows an embodiment after a process 102a, i.e. a partial smoothening, wherein the texture of the textured back surface 3a (and optionally textured front surface 2a) is partly smoothened in a single-sided manner (as depicted; or in a double-sided manner, not depicted). This may result in a rounding off of the valleys (see also FIG. 19). The textured back surface 3a after partly smoothening is further indicated with reference 30.

In a further alternative embodiment, it is alternatively possible to create texture in a single-sided manner on only the front surface 2a, by first creating texture in a two sided manner on the front and back surfaces 2a, 3a and subsequently polishing the textured back surface 3a.

Referring again to FIG. 1, in a subsequent process 103, a back surface field (BSF) layer 4 is created by diffusion of an n-type dopant into the back surface 3; 3a and a doped layer 2c is created by diffusion of an n-type dopant into the textured front surface 2. The doped layer 2c has the same conductivity type as the BSF layer 4 on the back surface 3; 3a.

In an embodiment, the process 103 comprises exposing the back surface 3; 3a to a gaseous n-type precursor in a tube furnace at elevated temperature. The n-type precursor contains the n-type dopant. In an exemplary case, the n-type dopant is phosphorus and the gaseous n-type precursor comprises $POCl_3$ (phosphoryl chloride). On the back surface of the silicon substrate a phosphorus containing glass layer (PSG) 5 is formed during the formation of the BSF layer. The PSG layer 5 acts as dopant source for the silicon substrate 1.

Process 103 is controlled by its process parameters in such a way that the doped layer 2c and the BSF layer 4 will be congruent with the textured shape of the respective surface. To this end, a thickness of the doped layer 2c and the BSF layer is arranged to be less than the height of texture features on the surface(s).

Other diffusion methods, e.g. belt furnace, and diffusion sources, e.g. phosphoric acid containing liquids, applied by spray, vapour, spinning, printing, etc., or plasma implantation doping, etc., may be used.

In an alternative embodiment, the creation of the BSF layer 4 is performed in a front-to-front configuration. This increases throughput and provides a partial screening of the textured front surface(s) from the dopant.

Figure 7:
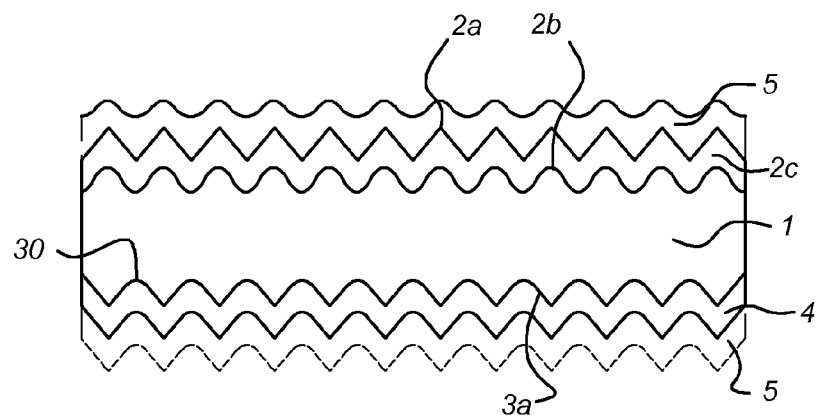
FIG. 7 shows a cross-section of the solar cell after a further stage of the method.

FIG. 7 shows a cross-section of the solar cell after process 103 for the creation of the back surface field layer.

In the subsequent process 103 on both the front surface 2 and back surface 3 of the silicon substrate 1 n-type doped layer 2c and BSF layer 4, are respectively created by diffusion of n-type dopant from an n-type dopant source into the front and back surfaces of the substrate 1.

On the back surface 3; 3a, the BSF layer 4 is formed. On the textured front surface 2a, the n-type doped layer 2c is formed which extends into the substrate 1 until an interface 2b. It is noted that the thickness of the n-type doped layer 2c is arranged to be less than the height of the texture features. In this manner the shape of the n-type doped layer 2c is congruent with the surface texture: i.e. the interface 2b also has a texture.

In the embodiment that the n-type dopant is phosphorus, on the textured front surface and the back surface of the silicon substrate a phosphorus containing glass layer (PSG) 5 is formed during the formation of the BSF layer and the n-type doped layer 2c.

The parameters of BSF diffusion may be specifically tuned, e.g. by increase of oxygen or $POCl_3$ flow, or addition of water vapor, to control the thickness of the PSG layers.

In an embodiment, the diffusion process may be carried out at an elevated temperature, which may be any suitable elevated temperature suitable for the specific diffusion process being applied, for instance depending on the materials that are used. The elevated temperature may also depend on the time during which the elevated temperature is applied. In general the elevated temperature may be between about 600 and about 1200° C., or between about 780-1200° C. The PSG layer 5 may act as dopant source for the silicon substrate 1.

In an embodiment, the diffusion of phosphorus (the dopant of the first conductivity type) is optimized to create a thickness of the back surface field layer and of the n-type doped layer 2c (a diffused layer containing the dopant of the first conductivity type) of about 0.7 microns.

In an alternative embodiment, a shallow back surface field layer and a shallow n-type doped layer 2c are created. The diffusion of phosphorus (the dopant of the first conductivity type) is then optimized to create a thickness of 0.3 micron or less for the BSF layer and the n-type doped layer 2c. Since the ability to retain texture is determined to some extent by the thickness of the n-type doped layer 2c, for a shallow n-type doped layer 2c (about 0.3 micron or less thick) the texture may be retained more fully and the reflectivity of the front surface may be lower than for a thicker n-type doped layer (say about 0.7 micron thick).

In FIG. 7, the embodiment is shown in which the back surface is flat, not textured. The skilled person will appreciate that the process 103 may also be executed on a substrate that comprises a textured back surface 3a.

Referring again to FIG. 1, in a following process 104, the method provides a removal of a layer such as a PSG layer covering n-type doped layers 2c and 4 from the textured front surface 2a and from the back surface 4 by an etching process i.e., either wet or dry etching.

Figure 8:
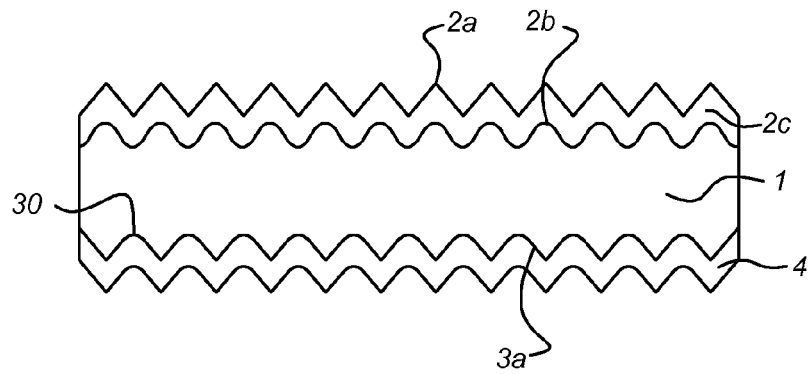
FIG. 8 shows a cross-section of the solar cell after a next stage of the method.

FIG. 8 shows a cross-section of the solar cell after process 104.

During process 104, the method provides a removal of any top layer such as the PSG layer from the doped layers on the back surface and the textured front surface, On the front surface the n-type doped layer 2c is exposed after the removal of the top layer such as the PSG layer. On the back surface the back surface field layer 4 is exposed after removal of the PSG layer.

Because the removal of the PSG layer exposes the semiconductor surface at the back surface and renders the back side hydrophobic it will beneficially help to avoid that in a further single sided etching process to remove the n-type doped layer 2c (as will be described below in more detail), the etching liquid will wet the back surface.

Referring again to FIG. 1, in a subsequent process 105, the method provides etching of the n-type doped layer 2c for removal from the textured front surface 2a by an etching agent. The etching agent is arranged to retain a texture of the front surface (second textured front surface 2b) so as to maintain a low reflectivity of the second textured front surface 2b. This can be satisfied if the shape of the n-type doped layer 2c on the front surface is congruent with the texture in the original textured front surface.

Such an etching agent may be an alkaline etching agent in case of a single-crystalline or a multi-crystalline substrate.

In an embodiment, a texturizing component of the alkaline etching agent comprises an alkaline component soluble in water such as potassium hydroxide or sodium hydroxide. In a further embodiment, the alkaline etching agent comprises one or more additives such as isopropanol.

Alternatively, the etching agent may be an acidic etching agent, which can be used for both single crystalline and multi-crystalline textured surfaces. The acidic etching agent can optionally be arranged for minor polishing, or it can be arranged for further texturing to increase the fine texture of the (second) textured front surface 2b.

In an embodiment, a polishing component of the acidic etching agent comprises an oxidizing component for creating an oxidized surface layer and an oxide etchant for etching the oxidized surface layer. In an example, the oxidizing component is nitric acid ($HNO_3$) and the oxide etchant is fluoric acid (HF). In a further example, the oxidizing component also comprises additives like water or acetic acid. A partial smoothening may for instance be performed by exposing the textured surface to such polishing component for 0.5-5 minutes. The ratio between $HNO_3$ and HF components may for example be in the range of 50:1 to 3:1.

A typical removal of silicon from the textured front surface would be between about 0.1 micron and about 2 micron. This will depend on the thickness of the n-type dopant layer 2c, i.e., the extension of the dopant concentration profile into the front surface. This will in turn depend on process parameters such as the temperature and the duration of the BSF-diffusion process.

In this embodiment, the etching is performed as a singleside etch; that means the etching liquid will wet the front surface, but not the rear surface or only a very minor edge region of the rear surface.

Alternatively, the etching can be done by a dry plasma etching step.

Experimentally it is verified that the texture is retained during the etching of the n-type doped layer 2c. An optical reflection of a light beam on the textured front surface at a wavelength of 1000 nm, after removing of the first conductivity doped layer, increases by less than 5% and preferably by less than 3%.

Figure 9:
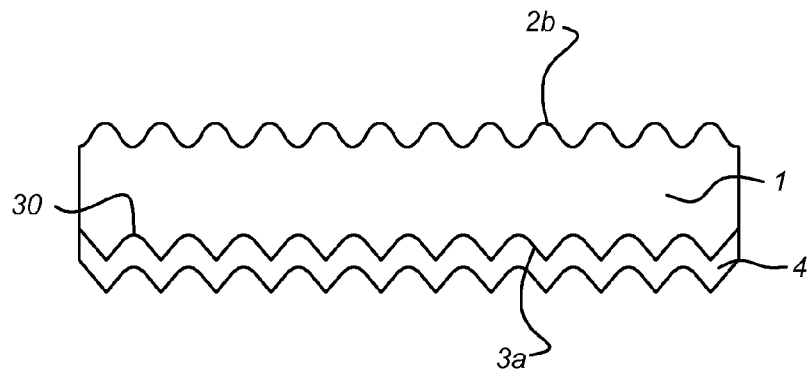
FIG. 9 shows a cross-section of the solar cell after a subsequent stage of the method.

FIG. 9 shows a cross-section of the solar cell after process 105.

During process 105, the exposed n-type doped layer 2c from the front surface is removed by an etching process. The etching process is arranged to retain a texture of the textured front surface (second textured front surface 2b after etching) so as to maintain a low reflectivity of the second textured front surface 2b.

Referring again to FIG. 1, in a next process 106, the method provides the creation of a p-type (emitter) layer 6 on the second textured front surface 2b. The second textured front surface 2b is exposed at elevated temperature to a p-type dopant.

The p-type dopant is for example boron. The p-type dopant may be a gaseous p-type precursor, for example a boron containing gas e.g. $BBr_3$ (boron tri bromide).

In an embodiment, the elevated temperature may be any suitable elevated temperature suitable for the specific diffusion process being applied for instance depending on the materials that are used. The elevated temperature may also depend on the time during which the elevated temperature is applied. In general the elevated temperature may be between about 700 and about 1200° C., or between about 780-1200° C.

During the process 106 for creating the emitter layer 6 which is a diffusion-driven process, a boron containing glassy layer (BSG layer) 7 is formed on the second textured front surface 2b and on the back surface 4.

It is noted that the BSF layer 4 on the back surface develops further by co-diffusion, i.e., diffusion of the n-type dopant from the BSF layer deeper into the silicon substrate simultaneously with the formation of the p-type emitter layer on the front surface.

In an embodiment, after co-diffusion the BSF layer has a sheet resistance between about 20 and about 30 Ohm/square and the emitter layer has a sheet resistance between about 50 and about 70 Ohm/square.

In another embodiment, after co-diffusion the BSF layer has a sheet resistance between about 5 and about 100 Ohm/square and the emitter layer has a sheet resistance between about 50 and about 150 Ohm/square.

In an alternative embodiment, advantageously, the diffusion is performed in a back-to-back configuration. This increases throughput and provides a partial screening of the back surface(s) from the dopant.

However, it is also noted that for solar cell efficiency the BSF advantageously has a higher doping level than the emitter. Concomitantly, if an emitter diffusion is performed on top of the BSF then this will usually not fully compensate the dopant level in the BSF layer. It is therefore usually not required to have a protection layer (such as a PSG or a dielectric coating such as $SiN_x$) on top of the BSF during the emitter diffusion. However, a partial compensation of the BSF by the emitter diffusion may reduce the field-effect passivation by the BSF. To eradicate such an effect one can use a protection layer as described in relation to FIG. 3 to prevent or minimize emitter diffusion on top of the BSF. Moreover, a higher doping level for the BSF enhances the rear-side field-effect passivation while a higher doping level in the emitter can enhance recombination losses.

Figure 10:
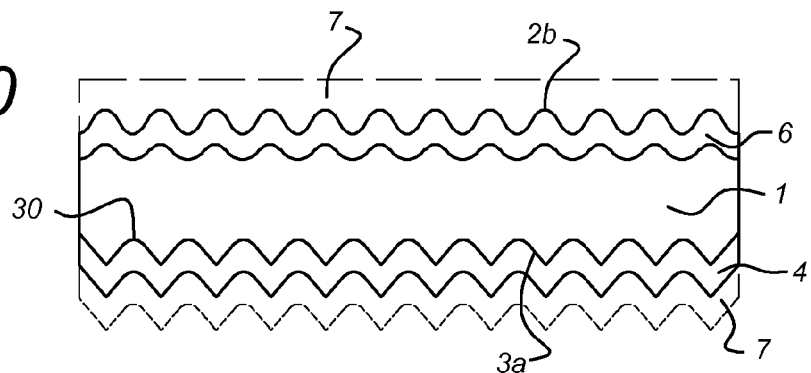
FIG. 10 shows a cross-section of the solar cell after a further stage of the method.

FIG. 10 shows a cross-section of the solar cell after process 106.

During process 106, the method provides the creation of a p-type (emitter) layer 6 by diffusion in the second textured front surface 2b.

The second textured front surface 2b is exposed to a p-type dopant, for example boron. The p-type dopant may be a boron containing gas e.g. $BBr_3$. A boron containing glassy layer (BSG layer) 7 is formed on the textured front surface 2b and on the back surface field layer 4 on the back surface.

It is noted that the creation of the p-type layer 6 may be done by various diffusion methods, e.g. tube or belt furnace, and diffusion sources, e.g. boric acid containing liquids, applied by spray, vapour, spinning, printing, etc., or plasma implantation doping.

Referring again to FIG. 1, next in process 107, the method provides a removal of the BSG layer 7 from the second textured front surface 2b and to expose the p-type emitter layer. Also, the method provides a removal of the BSG layer 7 from the back surface field layer 4 on the back surface and to expose the BSF layer.

After the sequence of processes as described above, the method provides a silicon substrate which comprises an n-type back surface field layer 4 on the back surface 3; 3a and a p-type emitter layer 6 on the second textured front surface 2b.

Figure 11:
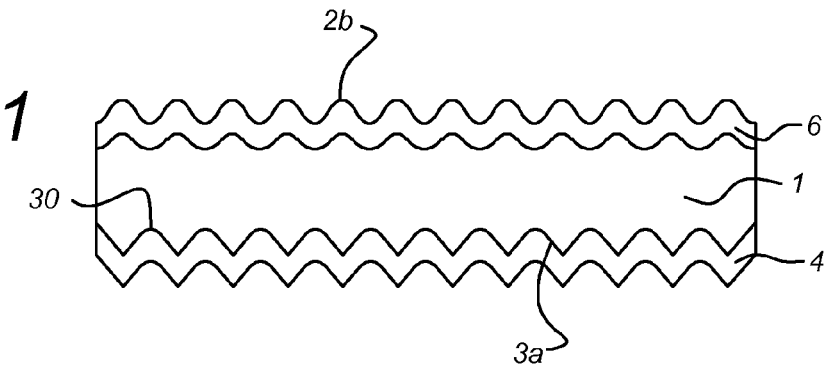
FIG. 11 shows a cross-section of the solar cell after yet a further stage of the method.

FIG. 11 shows a cross-section of the solar cell after process 107.

During process 107, the BSG layer 7 is removed from the p-type emitter layer 6 at the second textured front surface and from the back surface field layer 4 by etching. The solar cell in this stage comprises the silicon substrate 1, the back surface field layer 4 on the back surface 3 of the substrate, and a p-type emitter layer 6 on the second textured front surface 2b of the substrate.

The solar cell manufacturing process may be completed with methods known in the state of the art, such as depositions of passivating and antireflective coating, screen printing of metallization patterns, firing-through, junction isolation, etc. Hence, for instance the herein indicated passivation layer(s) may be applied to layer 4 and/or layer 6 (which are the doped layers).

Figure 2:
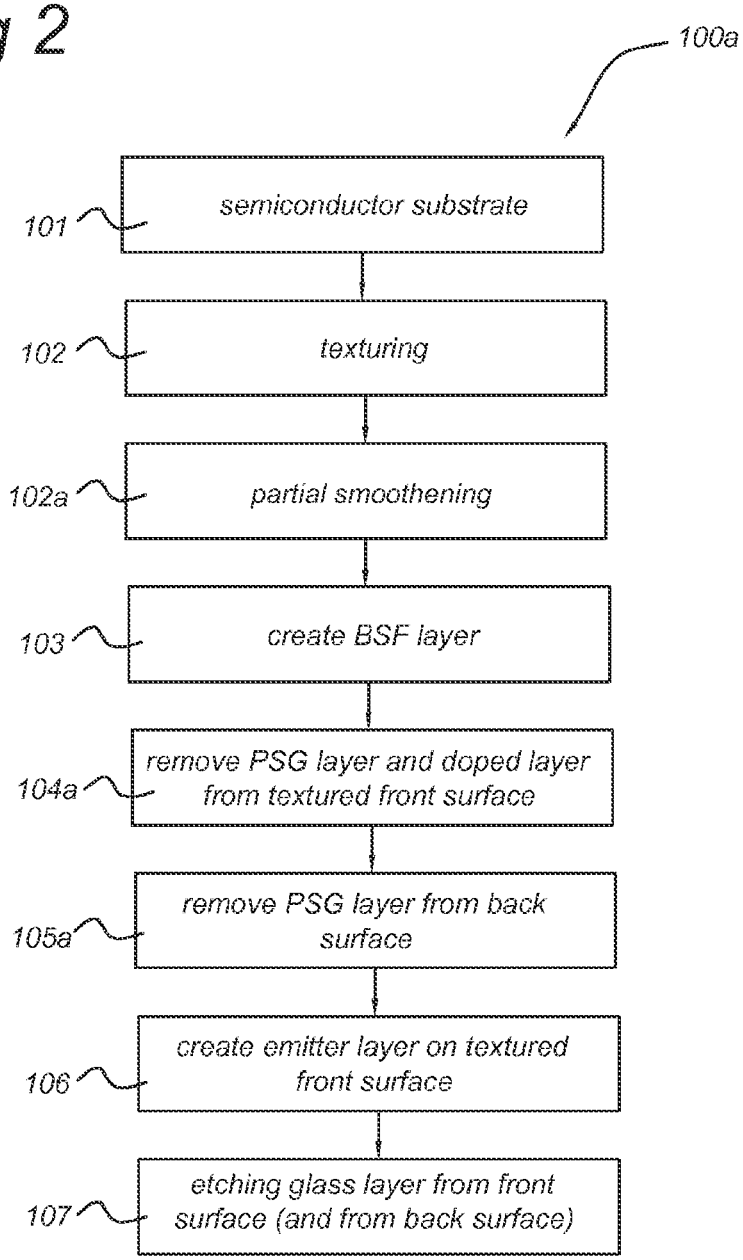
FIG. 2 shows a flow diagram for a method for manufacturing a solar cell in accordance with a second aspect of the invention.

FIG. 2 shows a flow diagram for a method 100a for manufacturing a solar cell in accordance with a second aspect of the invention.

In FIG. 2 entities with the same reference number as shown in the preceding figures refer to corresponding entities.

According to this aspect, in the sequence, after process 101, 102 and 103 (i.e., providing the semiconductor substrate; texturing at least the front surface of the semiconductor substrate, and the creation of the back surface field layers on the textured front surface and on the back surface), the method comprises in a process 104a a removal of the PSG layer 5 from the textured front surface and a removal of the n-type doped layer 2c from the textured front surface by a single side etching process.

Figure 12:
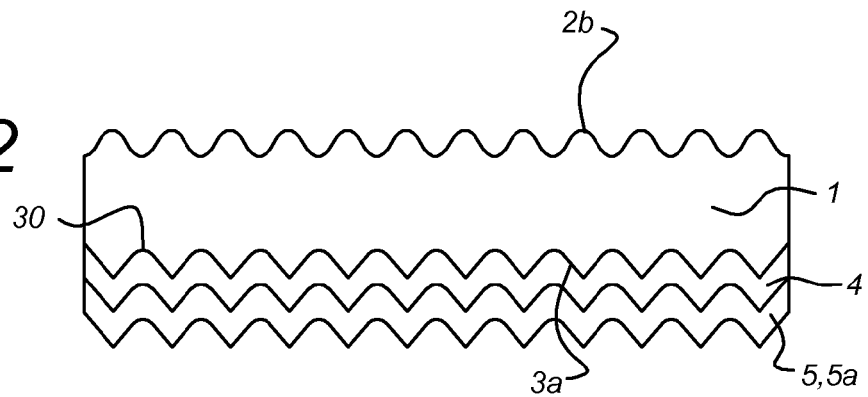
FIG. 12 shows a cross-section of the solar cell after a further stage in accordance with the second aspect.

FIG. 12 shows a cross-section of the solar cell after process 104a in accordance with the second aspect.

In FIG. 12 entities with the same reference number as shown in the preceding figures refer to corresponding entities.

After process 104a, the secondary textured front surface 2b is exposed, while on the back surface 3 the back surface field layer 4 is present directly on the semiconductor 1. The back surface field layer 4 is covered by the back surface PSG layer 5.

Referring again to FIG. 2, in a subsequent process 105a after process 104a, the method provides a removal of the PSG layer 5 from the back surface so as to expose the back surface field layer 4.

Figure 13:
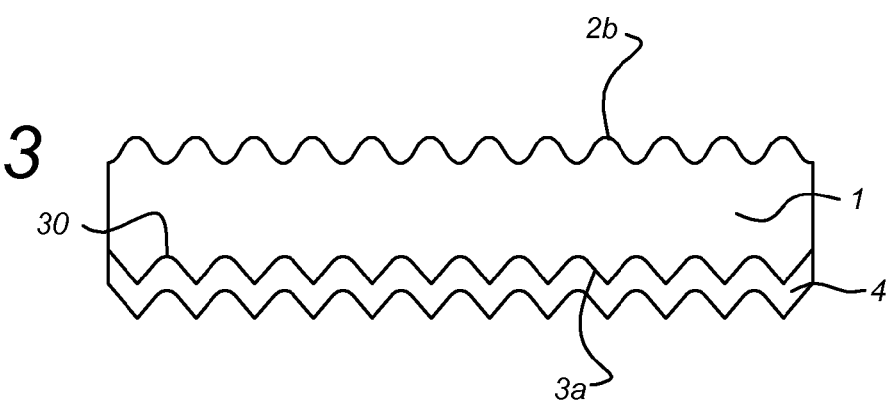
FIG. 13 shows a cross-section of the solar cell after a subsequent stage in accordance with the second aspect.

FIG. 13 shows a cross-section of the solar cell after process 105a.

Next, the method according to the second aspect of the invention continues with processes 106 and 107 as described above with reference to FIGS. 1, 10 and 11.

Figure 3:
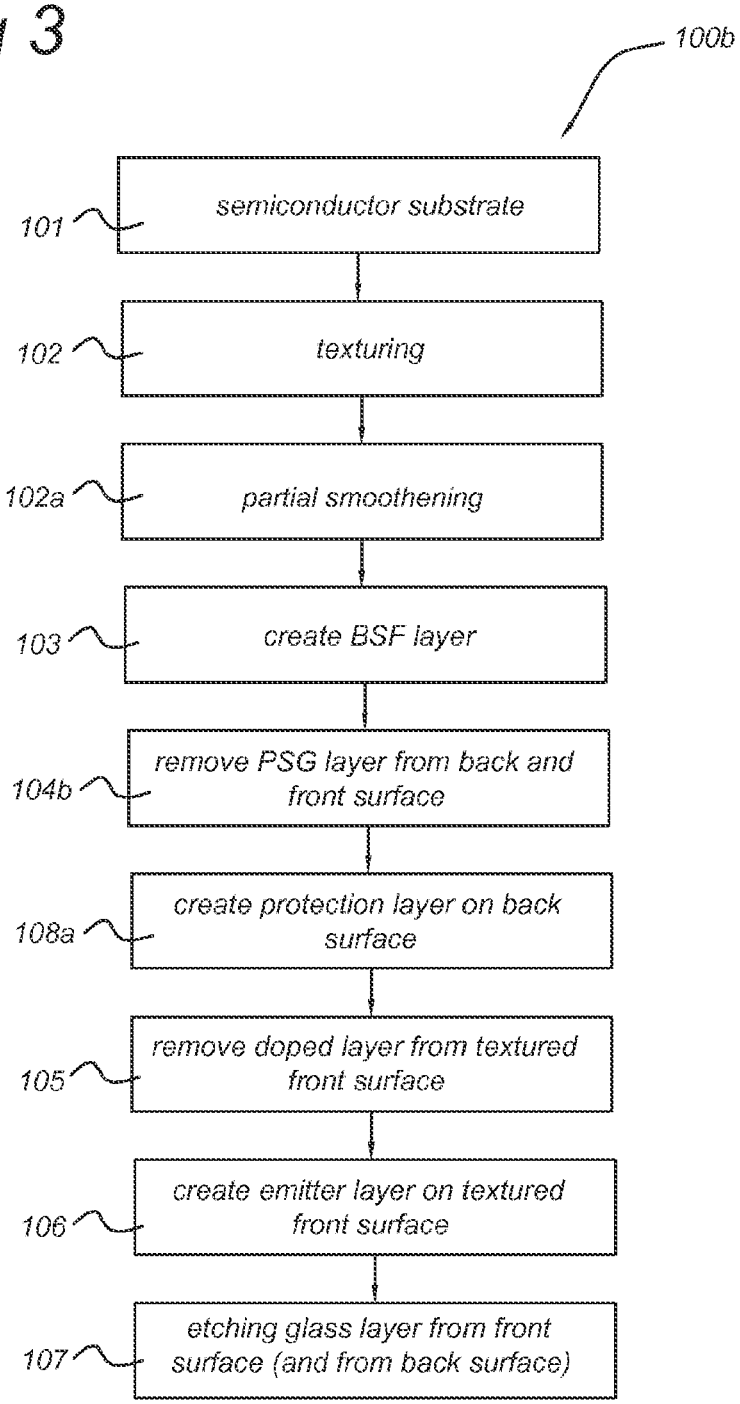
FIG. 3 shows a flow diagram for a method for manufacturing a solar cell in accordance with a third aspect of the invention.

FIG. 3 shows a flow diagram for a method 100b for manufacturing a solar cell in accordance with a third aspect of the invention.

In FIG. 3 entities with the same reference number as shown in the preceding figures refer to corresponding entities.

According to this aspect, in the sequence, after process 101, 102, 103 and 104 (i.e., providing the semiconductor substrate; texturing at least the front surface of the semiconductor substrate, the creation of the back surface field layers on the textured front surface and on the back surface, and the removal of the PSG layers from the textured front surface and the back surface), the method comprises in a process 108a a creation of a protective layer 5a on the back surface field layer 4.

Figure 14:
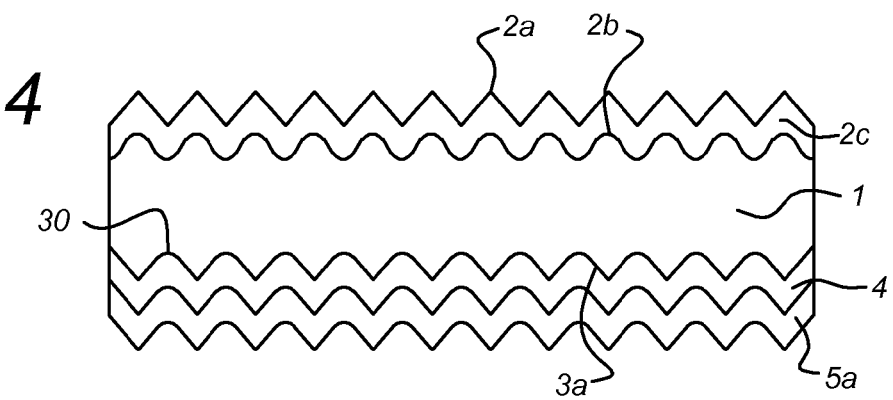
FIG. 14 shows a cross-section of the solar cell after a further stage in accordance with the third aspect.

FIG. 14 shows a cross-section of the solar cell after process 108a in accordance with the third aspect.

In FIG. 14 entities with the same reference number as shown in the preceding figures refer to corresponding entities.

After process 108a, the back surface 3 of the semiconductor substrate 1 is covered by the back surface field layer 4. The back surface field layer is covered by the protective layer 5a. On the textured front surface 2, the semiconductor substrate 1 is covered by the n-type doped layer 2c.

In an embodiment, the method provides a deposition of a coating layer as protective layer 5a on the back surface field layer 4. Such a coating layer may comprise aluminum oxide ($Al_2O_3$), silicon nitride ($SiN_x$), or another dielectric.

Figure 15:
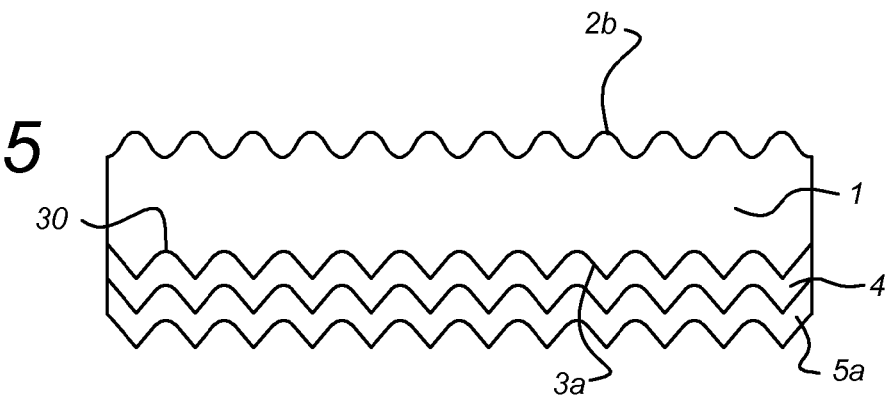
FIG. 15 shows a cross-section of the solar cell after a next stage in accordance with the third aspect.

Referring again to FIG. 3, after process 108a to create the protective layer 5a on the back surface field layer, the method continues with process 105 to remove the n-type doped layer 2c from the textured front surface by either a single sided etching process as described above with reference to FIG. 1 or by a two sided etching process since the protective layer covers the back surface field layer. The result is shown in FIG. 15 which shows a cross-section of the solar cell after process 105.

After process 105 to remove the n-type doped layer 2c from the textured front surface, the back surface 3 of the semiconductor substrate 1 is covered by the back surface field layer 4. The back surface field layer is covered by the protective layer 5a. The secondary textured front surface 2b is freely exposed.

Next, the method according to the third aspect of the invention continues with processes 106 and 107 as described above with reference to FIGS. 1, 10 and 11.

Figure 4:
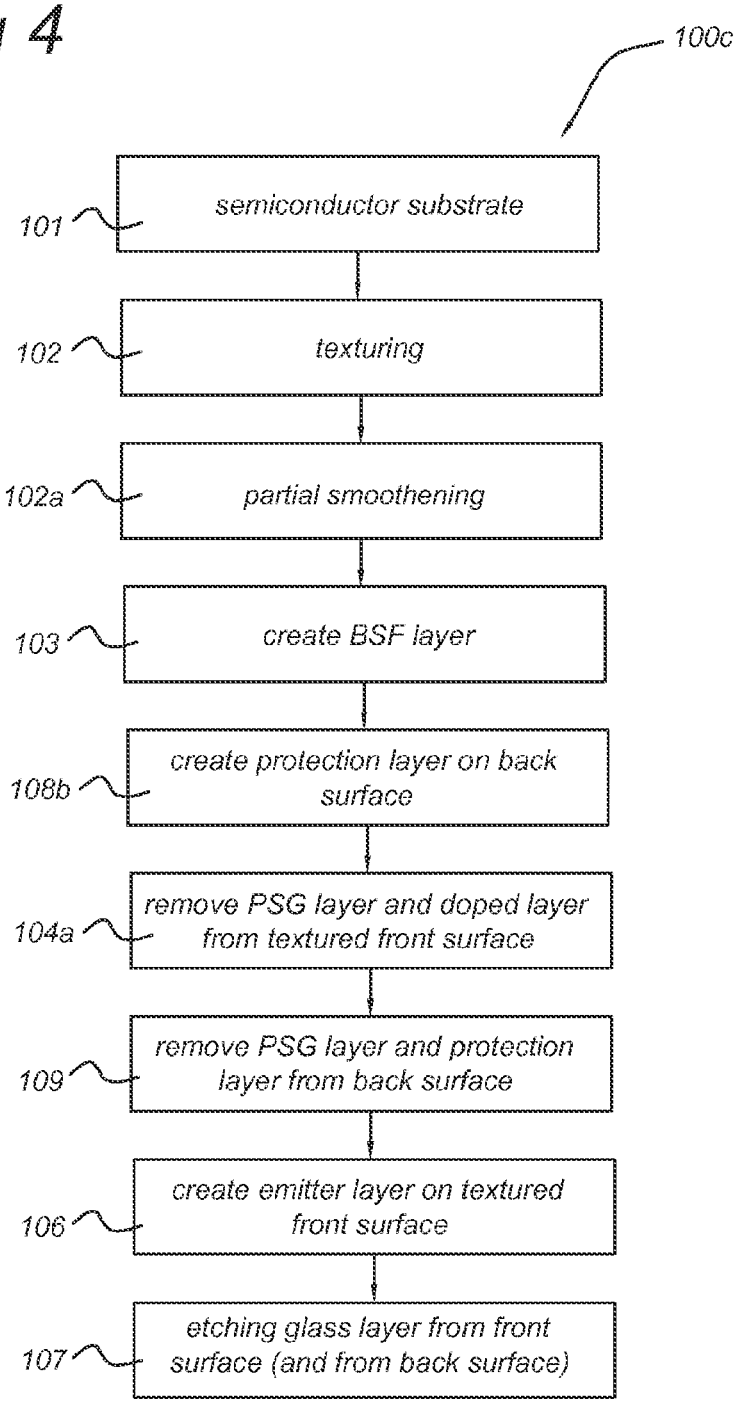
FIG. 4 shows a flow diagram for a method for manufacturing a solar cell in accordance with a fourth aspect of the invention.

FIG. 4 shows a flow diagram for a method 100c for manufacturing a solar cell in accordance with a fourth aspect of the invention.

In FIG. 4 entities with the same reference number as shown in the preceding figures refer to corresponding entities.

According to this aspect, in the sequence, after process 101, 102 and 103 (i.e., providing the semiconductor substrate; texturing at least the front surface of the semiconductor substrate, the creation of the back surface field layers on the textured front surface and on the back surface), the method comprises in a process 108b a creation of a protective layer 5a directly on the PSG layer 5 on the back surface of the semiconductor substrate.

In an embodiment, the method provides a deposition of a coating layer as protective layer 5a on the PSG layer 5. Such a coating layer may comprise aluminum oxide ($Al_2O_3$), silicon nitride ($SiN_x$), or another dielectric, or a resist, etc.

According to this fourth aspect, the PSG layer 5 on the back surface of the semiconductor substrate is not removed before the creation of the protective layer 5a.

Figure 16:
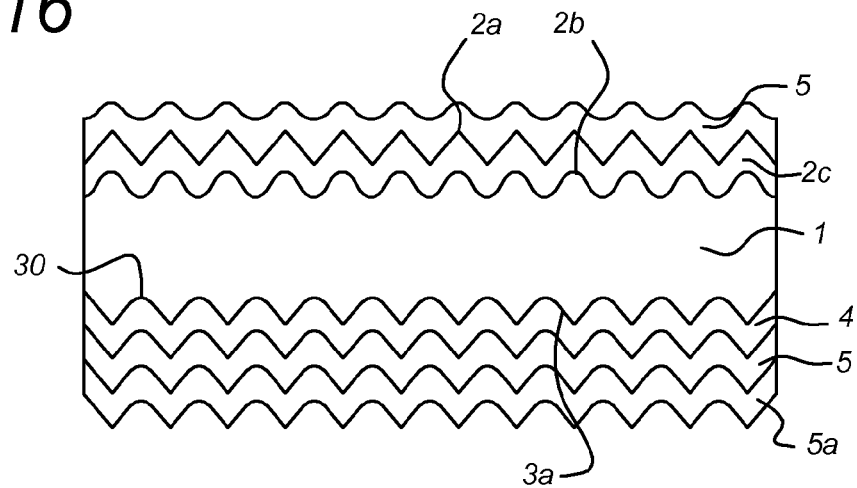
FIG. 16 shows a cross-section of the solar cell after a further stage in accordance with the fourth aspect.

FIG. 16 shows a cross-section of the solar cell after process 108b in accordance with the fourth aspect.

In FIG. 16 entities with the same reference number as shown in the preceding figures refer to corresponding entities.

After process 108b, the back surface 3 of the semiconductor substrate 1 is covered by the back surface field layer 4. The back surface field layer itself is covered by the PSG layer 5. The PSG layer 5 on the back surface field layer 4 is covered by the protective layer 5a. On the textured front surface 2, the semiconductor substrate 1 is covered by the n-type doped layer 2c.

The textured front surface of the semiconductor substrate is covered by the n-type doped layer 2c, which itself is covered by the front side PSG layer 5.

Referring again to FIG. 4, after process 108b to create the protective layer 5a on the back surface field layer 4, the method continues with a subsequent process 104a for a removal of the PSG layer 5 from the textured front surface and a removal of the n-type doped layer 2c from the textured front surface by either a single sided etching process or a two sided etching process.

Figure 17:
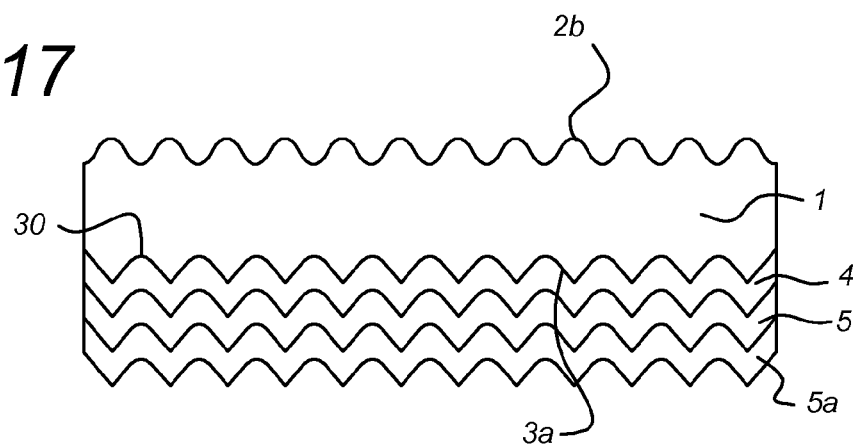
FIG. 17 shows a cross-section of the solar cell after a next stage in accordance with the fourth aspect.

FIG. 17 shows a cross-section of the solar cell after process 104a in accordance with the fourth aspect. In FIG. 17 entities with the same reference number as shown in the preceding figures refer to corresponding entities.

After process 104a, the back surface 3 of the semiconductor substrate 1 is still covered by the back surface field layer 4. The back surface field layer itself is covered by the PSG layer 5. The PSG layer 5 on the back surface field layer 4 is covered by the protective layer 5a. After removal of the PSG layer 5 and the n-type doped layer 2c from the textured front surface in process 104a, the textured front surface 2 of the semiconductor substrate 1 is exposed.

Referring again to FIG. 4, after process 104a to remove the PSG layer 5 and the n-type doped layer 2c from the textured front surface, the method continues with a further process 109 to remove the protective layer 5a and the PSG layer 5 from the back surface field layer 4.

Figure 18:
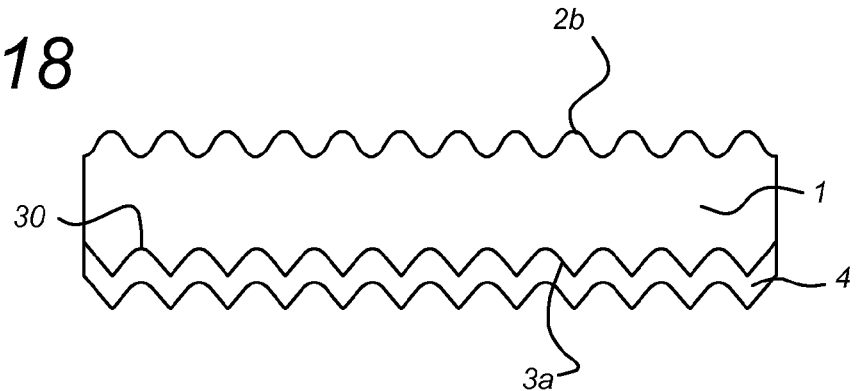
FIG. 18 shows a cross-section of the solar cell after a subsequent stage in accordance with the fourth aspect.

FIG. 18 shows a cross-section of the solar cell after process 109 in accordance with the fourth aspect.

In FIG. 18 entities with the same reference number as shown in the preceding figures refer to corresponding entities.

After process 109, the back surface 3 of the semiconductor substrate 1 is covered by the back surface field layer 4. The secondary textured front surface 2b is freely exposed.

Next, the method according to the fourth aspect of the invention continues with processes 106 and 107 as described above with reference to FIGS. 1, 10 and 11.

Figure 19A:
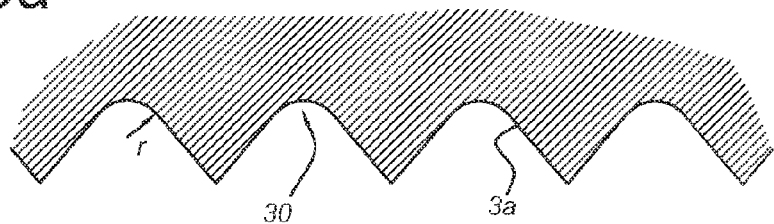
FIG. 19a shows in some more detail a surface texture (here the back surface 3a) after partial smoothening.
Figure 19B:
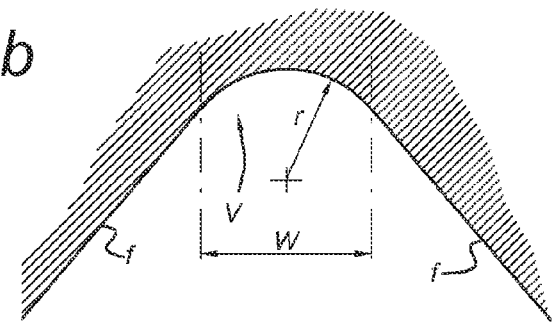
FIG. 19b shows in some more detail the interpretation of valley width and curvature.

FIG. 19a schematically depicts in more detail an embodiment of the textured back surface 3a after partial smoothening. The valleys in between the texture features (e.g. pyramid facets) are rounded, and may have radii selected from the range of about 25-250 nm. Alternatively, the radii may be selected from the range of about 250-1000 nm, which however may require longer processing time. Note that here the texture back surface 3a after partial smoothening is schematically displayed, whereas similarly, the textured front surface 2a may be partly smoothened. Hence, in an embodiment, FIG. 19a may equally display the textured front surface 2a after partly smoothening (which could then for instance be indicated with reference 20 (not depicted)). FIG. 19b in some more detail depicts the understanding of valley width and radius. Facets (or pyramid facets) f, especially the 111 crystal facets of Si, may meet in a valley v. In non-smoothened variants, the valley v at the bottom will be very narrow, i.e. w is small, such as <50 nm. After smoothening, the valley v may be a bit rounded, leading to a broader valley, with a width w for instance in the range of about 50-2000 nm. At least part of the valley v, after smoothening, may be curved, having a radius r in for instance in the range of about 25-250 nm. Preferably, the valley width w for the textured front face is in the range of 50-1000 nm, especially 50-500 nm. Preferably, the valley radii for the textured front face is in the range of about 25-500 nm, especially 25-250 nm.

Figure 20:
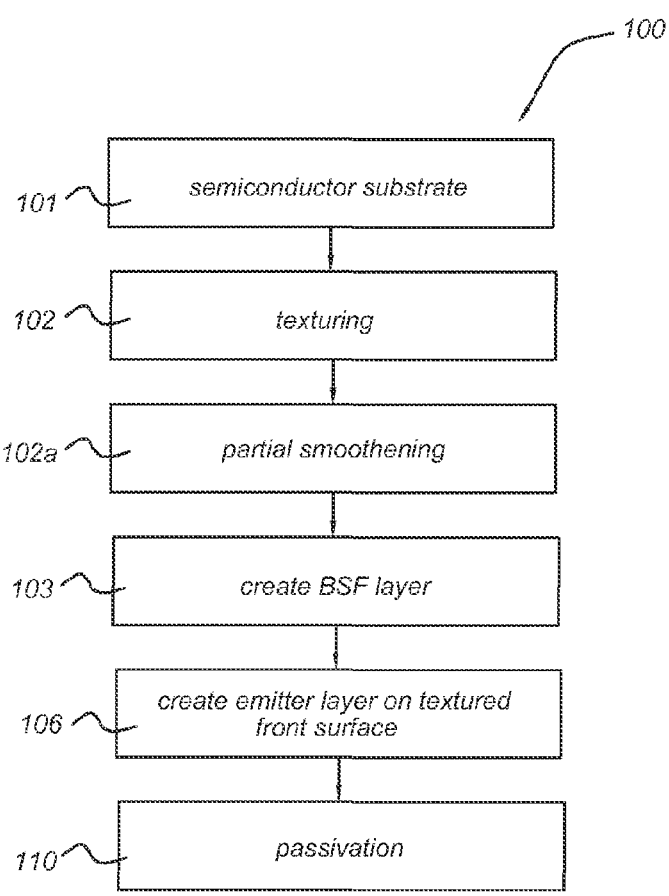
FIG. 20 depicts a flow diagram for an alternative method for manufacturing a solar cell.
Figure 21A:
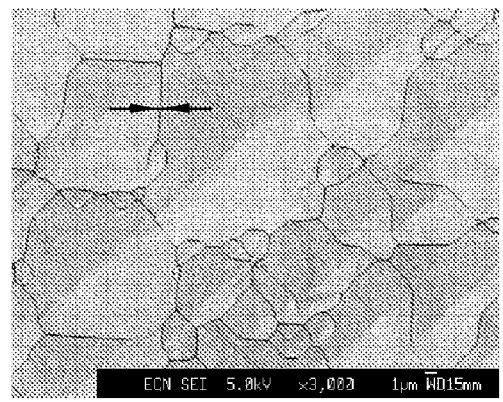
FIGS. 21a-21d show SEM figures of non-smoothened (21a-21b) and smoothened (21c-21d) pyramidal textures.
Figure 21B:
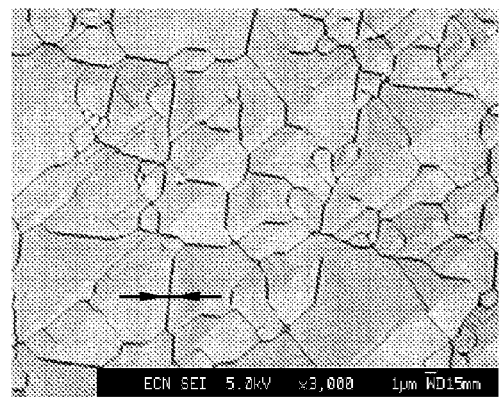
Figure 21C:
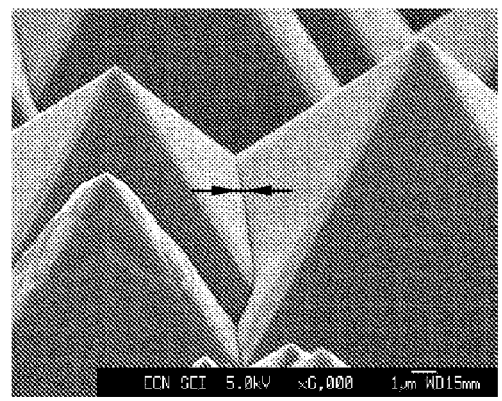
Figure 21D:
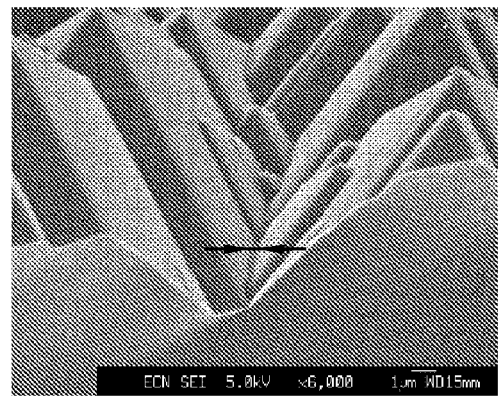

FIG. 20 schematically displays an alternative process. After the partial smoothening 102a (of the textured back surface and optionally the textured front surface), the BSF layer and the emitter layer are provided (processes 103 and 106). As will be clear to the person skilled in the art, the order of processes 103 and 106 in this embodiment may also be the other way around or they may be executed simultaneously.

Further, optionally (but preferably), a passivation process 110 is applied. A passivation layer may be applied on the BSF layer (and also the emitter layer). Note that in FIGS. 1-4 no passivation process 110 is depicted. However, such process may be applied after the etching glass layer process 107. Note that in FIGS. 5-19, such passivation layers have not been depicted.

A person skilled in the art will appreciate that the light-incident and back surface of the cell may be exchanged, in which case the BSF becomes a FSF, and the emitter will be located at the rear (non-light-incident) side of the cell. To retain low reflectance of the front side (FSF side) of the cell, the preferred valley width of the textured front surface is in the range of 50-1000 nm, especially 50-500 nm, and the preferred valley radii of the textured front surface is the range of about 25-500 nm, especially 25-250 nm.

It is noted that to obtain a back surface field BSF layer of p-type conductivity and an n-type dopant layer on the front surface, process 103 is to be carried out with p-type dopant such as boron, and process 106 is to be carried out with n-type dopant such as phosphorus.

As will be appreciated by the skilled person, due to the reversal of the conductivity types, the formation and removal of the PSG layers 5 and BSG layer 7 in the sequences as described above will be reversed and need to be adapted.

Advantageously, the method provides an enhanced manufacturing with less variation between individual solar cells. A parasitic doping (either p-type or n-type) from one surface of the silicon substrate to another surface, especially from the BSF side to the emitter side, is prevented by the method. Also, a screen printing step is omitted which reduces yield loss due to breakage. Moreover, two-sided diffusion of phosphorus in both front and back surfaces is possible, which results in an improved gettering of impurities from the silicon substrate. Additionally, the diffused back surface field layer improves the efficiency of the solar cell.

The skilled person will appreciate that alternatively, it is not needed to form PSG layer(s) or BSG layer(s) while creating the n or p type doped layer at either the back surface or the front surface, depending on the actual precursor of the dopant(s). in that case, the above mentioned process steps to remove a BSG or PSG glassy layer can be omitted.

It will be apparent to the person skilled in the art that other embodiments of the invention can be conceived and reduced to practice without departing from the true spirit of the invention, the scope of the invention being limited only by the appended claims. The description illustrates the invention and is not intended to limit the invention.

EXAMPLES

In an experiment, cells were compared from 3 groups of wafers with the following variation of processing: i) no step 102a, ii) step 102a with a partial smoothening resulting in a wafer thickness reduction >0.1 micron but <1 micron on average, and iii) processed with the same partial smoothening as ii), repeated 3 times total.

Both groups ii) and iii) showed an increase of 5 mV of the average open circuit voltage, with a statistical uncertainty (95% confidence interval) of 1 mV. The average short circuit current increased by 0.5% with a statistical uncertainty of 0.1%. This clearly proves that the rear surface passivation is improved by the partial smoothening.

|  | no partial smoothening | once partial smoothening | three times partial smoothening |
|---|---|---|---|
| Voc | $U_o$ (reference value) | $U_o$ + 5 mV ± 0.5 mV | $U_o$ + 5 mV ± 0.5 mV |
| Isc | $I_o$ (reference value) | $I_o$ * (1.005 ± 0.0005) | $I_o$ * (1.005 ± 0.0005) |

In agreement with this, the external quantum efficiency measured with light incident on the rear surface of the cell shows an increase of 10% at a wavelength of 400 nm for groups ii) and iii). The reflectance measured on the rear surface only increases with about 1-2% for wavelengths from 600-1000 nm.

FIGS. 21a-21d shows the SEM images before (21a-21b) and after (21c-21d) the partial smoothening on a random pyramid textured wafer surface. It is clear that without partial smoothening the width of the valleys is <50 nm, whereas after partial smoothening in this example the width is ~200 nm.

The invention claimed is:

1. A method for manufacturing a solar cell from a semiconductor substrate of a first conductivity type, the semiconductor substrate having a front surface and a back surface, the method comprising:
    texturing the front surface to create a textured front surface and texturing the back surface to create a textured back surface; with texture features, such as pyramidal shapes, on the respective surface with valleys in between the texture features;
    performing etching for partly smoothening the textured back surface and optionally partly smoothening the textured front surface; said partly smoothening comprising either a broadening or a rounding of the valleys;
    creating by diffusion of a dopant of the first conductivity type a back surface field layer of the first conductivity type in the back surface, and a first conductivity-type doped layer in the textured front surface; removing the first conductivity-type doped layer from the textured front surface by an etching process adapted for retaining texture of the textured front surface; and
    creating a layer of a second conductivity type on the textured front surface by diffusion of a dopant of the second conductivity type into the textured front surface.

2. The method according to claim 1, wherein texturing the front surface to create a textured front surface comprises texturing the back surface to create a textured back surface.

3. The method according to claim 1, wherein texturing the front surface and texturing the back surface includes creating a pyramidal shapes containing front surface and a pyramidal shapes containing back surface.

4. The method according to claim 3, wherein the partial smoothening includes broadening intermediate valleys between pyramidal shapes to provide valleys with widths selected from the range of 50-2000 nm.

5. The method according to claim 3, wherein the partial smoothening includes rounding intermediate valleys between pyramidal shapes to provide valleys with curvatures having radii selected from the range of 25-1000 nm.

6. The method according to claim 1, further including creating a passivation layer, such as selected from the group consisting of silicon nitride, silicon oxide, silicon carbide, and aluminum oxide, and optionally other materials, on one or both doped layers.

7. The method according to claim 6, wherein the passivation layer is created by one or more of the following techniques: plasma enhanced chemical vapor deposition, low pressure chemical vapor deposition, atmospheric pressure chemical vapor deposition, sputtering, atomic layer deposition, wet chemical oxidation.

8. The method according to claim 1, comprising during the diffusion of the dopant of the first conductivity type, a formation of a dopant containing glassy layer on the front surface and the back surface from a precursor of the first conductivity type, the dopant containing glassy layer acting as dopant source for the semiconductor substrate.

9. The method according to claim 8, comprising removing the dopant containing glassy layer from the front surface and the back surface preceding the removal of the first conductivity-type doped layer from the textured front surface.

10. The method according to claim 8, comprising removing the dopant containing glassy layer from the front surface while removing the first conductivity-type doped layer from the textured front surface, in a single sided etching process.

11. The method according to claim 10, comprising removing the dopant containing glassy layer from the back surface after the removal of the dopant containing glassy layer from the front surface and the first conductivity-type doped layer from the textured front surface in the single sided etching process.

12. The method according to claim 10, comprising:
after creating the first conductivity-type doped layer in the textured front surface and the back surface field layer of the first conductivity type in the back surface:
creating a protective layer on the back surface field layer, before the removal of the dopant containing glassy layer from the front surface while removing the first conductivity-type doped layer from the textured front surface in a single sided etching process.

13. The method according to claim 12, comprising: after the removal of the dopant containing glassy layer from the front surface while removing the first conductivity-type doped layer from the textured front surface in a single sided etching process and preceding the creation of the layer of the second conductivity type on the textured front surface:
removing the protective layer and the dopant containing glassy layer from the back surface.

14. The method according to claim 8, comprising preceding the removal of the first conductivity-type doped layer from the textured front surface:
removing the dopant containing glassy layer from the front surface and the back surface, and
creating a protective layer on the back surface field layer.

15. The method according to claim 14, wherein the protective layer comprises a coating layer containing at least one material selected from a group of aluminum oxide ($Al_2O_3$), silicon nitride ($SiN_x$), a dielectric, and a resist.

16. The method according to claim 8, wherein the removing of the first conductivity type doped layer from the textured front side and the dopant containing glassy layer from the front surface is performed during the etching process adapted for retaining texture of the textured front surface.

17. The method according to claim 1, wherein creating the back surface field layer by diffusion of the dopant of the first conductivity type comprises exposing the back surface to a precursor of the first conductivity type at elevated temperature.

18. The method according to claim 17 herein the precursor of the first conductivity type contains the dopant of the first conductivity type; the precursor being selected from one of a gaseous precursor, a liquid precursor, a paste precursor and a plasma precursor.

19. The method according to claim 1, wherein the diffusion of the dopant of the first conductivity type is optimized to create a thickness of the first conductivity-type doped layer in the textured back surface which is 0.7 micron or less.

20. The method according to claim 1, wherein the diffusion of the dopant of the first conductivity type is optimized to create a thickness of the first conductivity-type doped layer in the textured back surface which is 0.3 micron or less.

21. The method according to claim 1, wherein creating the layer of the second conductivity type on the textured front surface by diffusion of the dopant of the second conductivity type comprises exposing the textured front surface to a precursor of the second conductivity type at elevated temperature.

22. The method according to claim 21, wherein the precursor of the second conductivity type is a gaseous precursor, the gaseous precursor containing the dopant of the second conductivity type.

23. The method according to claim 21, wherein a thickness of the first conductivity-type doped layer is less than an average height of a texture feature on the textured front surface.

24. The method according to claim 23, wherein the average height of the texture feature on the textured front surface is at least about 2 micron and the thickness of the first conductivity type doped layer is about 0.7 micron or less.

25. The method according to claim 23, wherein the average height of the texture feature on the textured front surface is at least about 2 micron and the thickness of the first conductivity type doped layer is about 0.3 micron or less.

26. The method according to claim 1, wherein the first conductivity type is n-type and the second conductivity type is p-type, or the first conductivity type is p-type and the second conductivity type is n-type.

27. The method according to claim 1, wherein the etching process adapted for retaining texture of the textured front surface is performed by a single-sided wet-chemical process using an etching agent.

28. The method according to claim 1, wherein the partial smoothening comprises etching the textured back surface and optionally the textured front surface with an etching agent.

29. The method according to claim 28, wherein the etching agent further comprises a component for polishing the semiconductor surface.

30. The method according to claim 1, wherein the partial smoothening is performed by dry etching the textured back surface and optionally the textured front surface.

31. The method according to claim 1, wherein the etching process adapted for retaining texture of the textured front surface is performed by a dry etching method.

\* \* \* \* \*